United States Patent
Dobler

(10) Patent No.: US 6,868,018 B2
(45) Date of Patent: Mar. 15, 2005

(54) MEMORY CIRCUIT, METHOD FOR MANUFACTURING AND METHOD FOR OPERATING THE SAME

(75) Inventor: Manfred Dobler, München (DE)

(73) Assignee: Infineon Technologies AG, Munich (DE)

( * ) Notice: Subject to any disclaimer, the term of this patent is extended or adjusted under 35 U.S.C. 154(b) by 12 days.

(21) Appl. No.: 10/431,422

(22) Filed: May 7, 2003

(65) Prior Publication Data

US 2003/0210592 A1 Nov. 13, 2003

(30) Foreign Application Priority Data

May 7, 2002 (DE) .......................................... 102 20 354

(51) Int. Cl.$^7$ ................................................. G11C 7/00
(52) U.S. Cl. ............................. 365/189.09; 365/225.7; 365/233
(58) Field of Search ......................... 365/189.05, 225.7, 365/233

(56) References Cited

U.S. PATENT DOCUMENTS

| | | | | |
|---|---|---|---|---|
| 4,430,581 A | * | 2/1984 | Mogi et al. ................. | 327/534 |
| 5,376,840 A | * | 12/1994 | Nakayama ............. | 365/189.09 |
| 5,903,513 A | | 5/1999 | Itou | |
| 6,775,197 B2 | * | 8/2004 | Novosel et al. .......... | 365/225.7 |
| 2001/0026477 A1 | * | 10/2001 | Manning ................ | 365/189.09 |

FOREIGN PATENT DOCUMENTS

DE        197 48 031 A1    10/1998

OTHER PUBLICATIONS

Weinfurtner, O.: "Advanced Controlling Scheme for a DRAM Voltage Generator System", IEEE Journal of Solid-State Circuits, vol. 35, No. 4, Apr. 2000, pp. 552–563.

* cited by examiner

Primary Examiner—Huan Hoang
(74) Attorney, Agent, or Firm—Laurence A. Greenberg; Werner H. Stemer; Ralph E. Locher

(57) ABSTRACT

A memory circuit includes one or several voltage generators for generating operating voltages for memory elements of the memory circuit and a means for selectively setting a current which may be supplied by one of the one or several voltage generators depending on an operating frequency for the memory circuit.

10 Claims, 4 Drawing Sheets

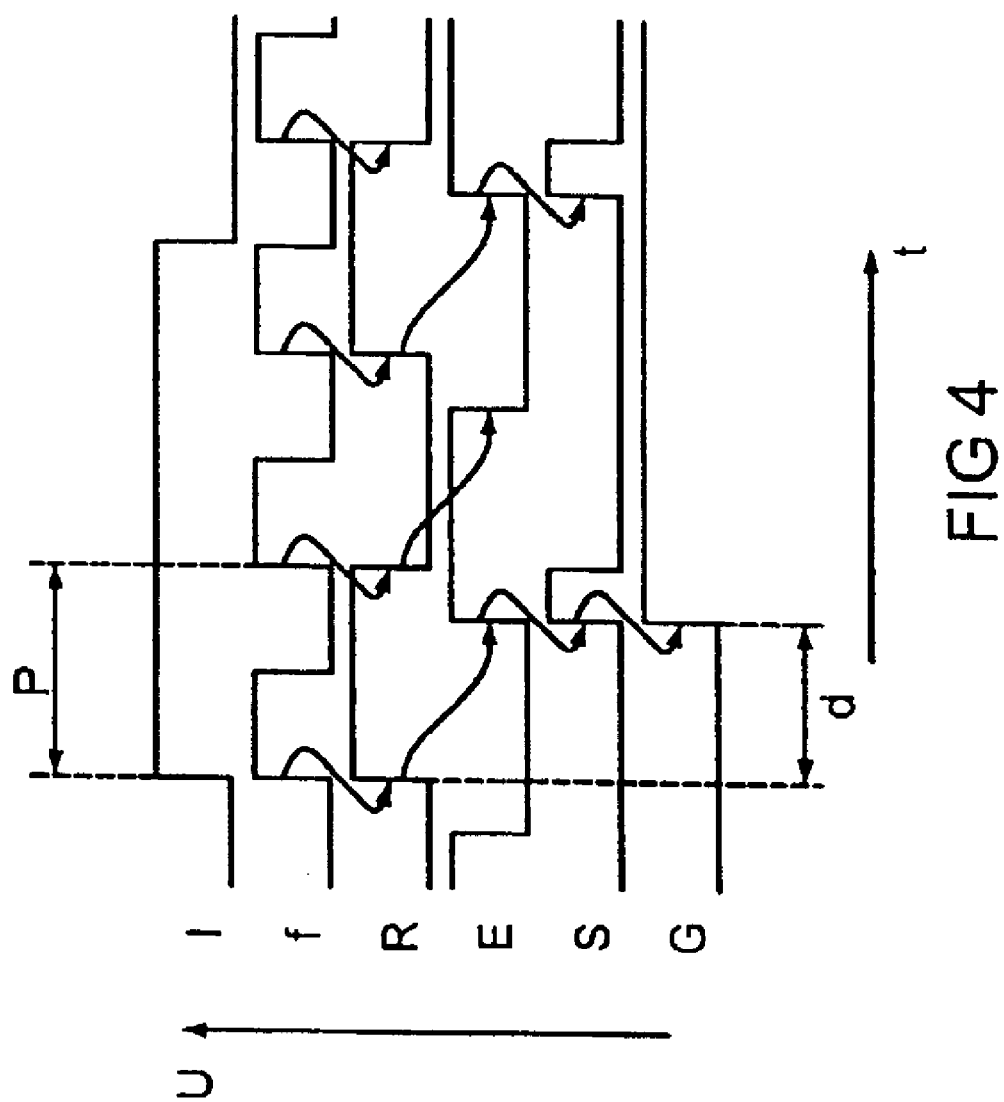

MEMORY CIRCUIT, METHOD FOR MANUFACTURING AND METHOD FOR OPERATING THE SAME

BACKGROUND OF THE INVENTION

1. Field of the Invention

The present invention relates to a memory circuit in which the current which may be supplied by voltage generators is settable, and to a method for manufacturing and a method for operating the same.

2. Description of the Related Art

High-speed memory devices (SDRAM) require several on-chip voltage generators for generating different voltages and operating voltages, respectively ($V_{INT}$, $V_{BLH}$, $V_{PP}$ etc.) from a supply voltage supplied from the outside. The currents drawn off from the voltage generators by downstream loads are strongly dependent on the clock frequency. The performance features and the number of voltage generators are implemented to guarantee worst case currents also with a maximum clock frequency of the memory circuit. If the memory circuit is operated below or far below its maximum clock frequency, as it is for example regularly the case with server applications, the number of voltage generators is unnecessarily high. As on the other hand the inherent current consumption of the voltage generators is only little or not dependent on the power they give off to downstream circuits, with clock frequencies below the maximum clock frequency also the current consumption or the current reception or the power reception, respectively, of the voltage generators is not optimum but unnecessarily high. As the inherent current consumption of the voltage generators typically represents two thirds of the overall current consumption of the memory circuit, it has a significant technical and economic importance, as the overall current consumption and its minimization with server applications, respectively, will be more and more important in the future.

SUMMARY OF THE INVENTION

It is the object of the present invention to provide a memory circuit, a method for manufacturing a memory circuit and a method for operating a memory circuit which facilitate a reduction of the current consumption in a simply way.

In accordance with a first aspect of the present invention, this object is achieved by a memory circuit including one or several voltage generators for generating operating voltages for memory elements of the memory circuit and a means for selectively setting a current which may be supplied by one of the one or of the several voltage generators depending on an operating frequency of the memory circuit.

In accordance with a second aspect of the present invention, this object is achieved by a method for manufacturing a memory circuit, comprising:

providing a plurality of voltage generators; determining, whether an operating frequency of the memory circuit is lower than a predetermined boundary frequency; and deactivating a plurality of voltage generators when the operating frequency is lower than the predetermined boundary frequency.

In accordance with a third aspect of the present invention, this object is achieved by a method for operating a memory circuit comprising a plurality of voltage generators, comprising:

determining, whether an operating frequency of the memory circuit is lower than a predetermined boundary frequency; and deactivating one of the voltage generators when the operating frequency is lower than the boundary frequency.

The present invention is based on the idea to minimize the current consumption of a memory circuit by setting a current, which may be supplied by one or several voltage generators, depending on an operating frequency of the memory circuit or, respectively, adjusting the same to the current which depends on the operating frequency and is required by the memory circuit.

The required current is therefore the current which is drawn off from the memory elements in the worst case, when an operating voltage is applied to the memory elements by the one or the several voltage generators. The current drawn from a respective memory element may thereby be both dependent on the memory state of the memory element and also on the control signals and data signals applied to the same.

One advantage of the present invention is, that with the current which may be supplied also the current consumption of the one or the several voltage generators may be set and therefore need not be higher than is technically required. Typically, with an operating frequency of 75 MHz the maximum current requirements of the circuits loading the voltage generators is only half as high as with a frequency of 166 MHz. For example, an SDRAM memory circuit designed according to the Intel Spec PC166 consumes a standby current (ICC3N; defined according to the JEDEC standard) of app. 30 mA after switching same in an active state, of which about three thirds may be ascribed to the inherent current consumption of the voltage generators. Consequently, the current consumption of the inventive SDRAM memory circuit is decreased by about 10 mA at 75 MHz.

According to one preferred embodiment, the memory circuit includes several voltage generators which may be deactivated selectively depending on the operating frequency of the memory circuit. The selective deactivation is either performed during the manufacturing of the memory circuit by masking or blowing a meltable fuse or during the operation by a means provided for this purpose within or at the memory circuit. In both cases, the current consumption of the memory circuit is minimized depending on the operating frequency for which the memory circuit is provided and on the operating frequency, respectively, at which the memory circuit is operated, without a cost and time consuming development of a special low power design. Deactivating and activating, respectively, of individual voltage generators depending on the operating frequency thereby only requires a minimum additional circuit-related effort, enables, however, the use of high-speed DRAM as a performance-optimized low-speed DRAM. By the frequency-dependent activation of voltage generators an adjustment of the memory circuits to two, three or more frequency categories and intervals, respectively, of the operating frequency may be performed.

Preferred embodiments of the present invention are defined in the sub-claims.

BRIEF DESCRIPTION OF THE DRAWINGS

In the following, preferred embodiments of the present invention are explained in more detail referring to the accompanying drawings, in which:

FIG. 4 shows a schematical illustration of time-dependencies of signals at the circuit of FIG. 2.

DESCRIPTION OF THE PREFERRED EMBODIMENTS

Figure 1:
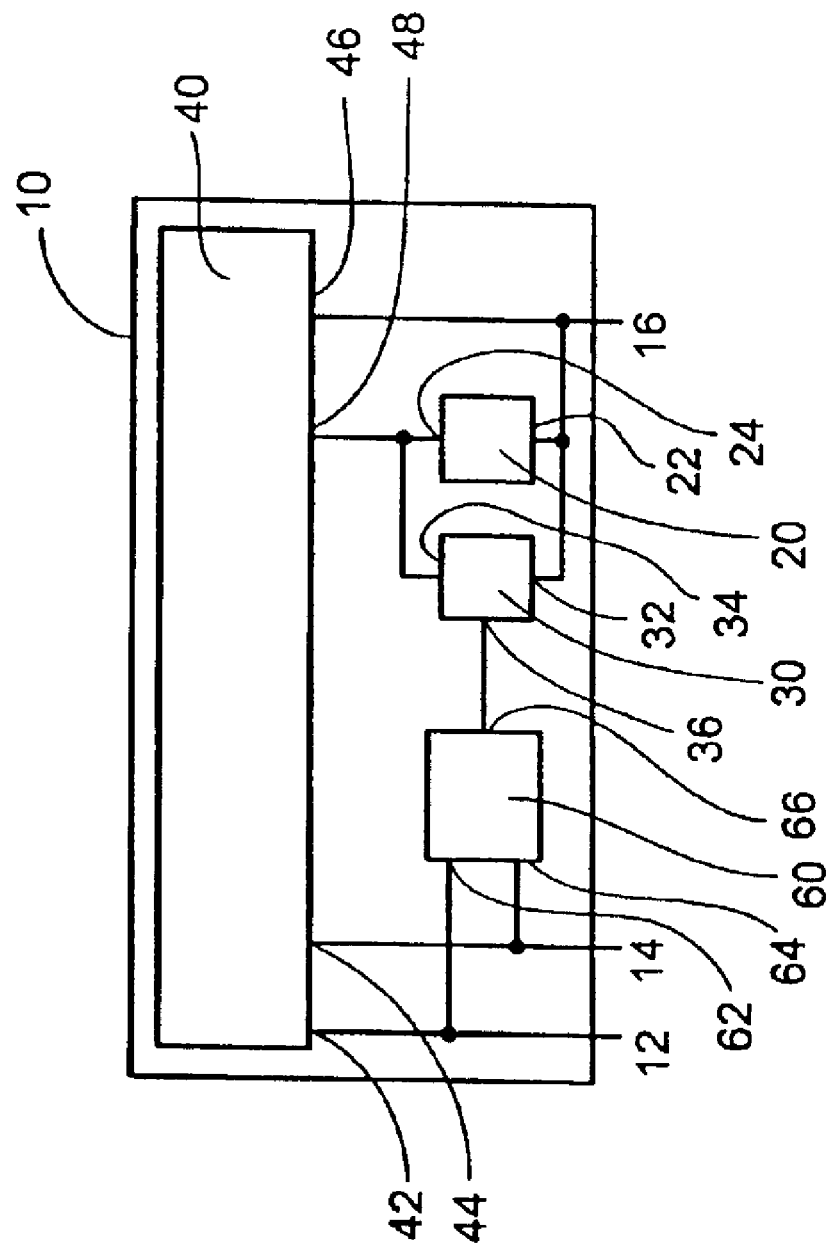
FIG. 1 shows a schematical illustration of a memory circuit according to a first embodiment of the present invention.

FIG. 1 is a schematical illustration of a memory circuit 10 according to the present invention. The memory circuit 10 includes a clock signal input 12 for receiving a clock signal, an initialization signal input 14 for receiving an initialization signal and a power supply input 16 for receiving electrical power which is fed to all components of the memory circuit 10, which require a supply of electric power during the operation. In FIG. 1, further a first voltage generator 20 with a power supply input 22 and a voltage output 24 and a second voltage generator 30 with a power supply input 32, a voltage output 34 and a deactivation input 36 are illustrated. All further conventional components and functional elements of the memory circuit 10 are schematically combined to form a memory circuit block 40 with a clock signal input 42, an initialization signal input 44, a power supply input 46 and a voltage input 48.

The clock signal input 42 of the memory circuit block 40 is connected to the clock signal input 12 of the memory circuit 10, the initialization signal input 44 of the memory circuit block 40 is connected to the initialization signal input of the memory circuit 10, the power supply input 46 of the memory circuit block 40 is connected to the power supply input 16 of the memory circuit 10 and the voltage input 48 of the memory circuit block 40 is connected to the voltage output 24 of the first voltage generator 20 and to the voltage output 34 of the second voltage generator 30. The power supply input 16 of the memory circuit 10 is further connected to the power supply input 22 of the first memory circuit 20 and to the power supply input 32 of the second memory circuit 30.

Via the clock signal input 12, the initialization signal input 14 and the power supply input 16 the memory circuit 10 and therefore its components and functional elements are connected to an exterior circuit which not illustrated, for example a working memory bus or a memory driver circuit, which feeds a clock signal, an initialization signal and a supply power to the memory circuit 10. The voltage generators 20, 30 take up current and therefore electric power via their power supply inputs 22, 32, and generate an operating voltage which is supplied to the other illustrated components and functional elements summarily by the memory circuit block 40.

Apart from the illustrated inputs and outputs, connecting lines, components and functional elements, the memory circuit 10 includes numerous further elements, whose illustration is not required for the understanding of the present invention and which are therefore omitted for reasons of clarity. In particular, a memory circuit generally comprises numerous control, address and data inputs and outputs.

The voltage generators 20, 30 supply a voltage and operating voltage, respectively, to the components and functional elements within the memory circuit block 40, for example to memory cells within the same, via the voltage outputs 24, 34, wherein the components and functional elements draw a current and therefore take up power depending on this operating voltage. This power is strongly dependent on an operating frequency and a frequency of a clock signal clocking the memory circuit 10, respectively. Apart from that, this power is dependent on the currently performed operations (write, read, delete, etc.). The design of the voltage generators (20, 30) and their number is based on the maximum power and current reception, respectively, in the worst case and at the maximum operating frequency of the memory circuit 10.

The electric power which is taken up by the voltage generators 20, 30 via their power supply inputs 22, 32, is thereby not or only weakly dependent on the power given off at the voltage outputs 24, 34. The current consumption of the voltage generators 20, 30 is therefore not or not substantially determined by the currently applied operating frequency of the memory circuit 10 but basically only by its maximum operating frequency. With many applications memory circuits are operated at operating frequencies which are substantially lower than their maximum operating frequency. In these cases, the current consumption of the voltage generators 20, 30 and therefore of the overall memory circuit 10 is substantially higher than necessary.

The present invention provides to reduce the current consumption of the voltage generators 20, 30 depending on the operating frequency. According to the present embodiment, a means 60 for selectively deactivating the voltage generators 20, 30 depending on the operating frequency is provided. The means 60 includes a clock signal input 62 connected to the clock signal input 12 of the memory circuit 10, an initialization signal input 64 connected to the initialization signal input 14 of the memory circuit 10 and a deactivation signal output 66 connected to the deactivation signal input 36 of the second voltage generator 30. As long as an initialization signal is applied to the initialization signal input 14 of the memory circuit 10 and therefore also to the initialization signal input 64 of the means 60, the means 60 determines whether the operating frequency or the frequency of the clock signal applied to the clock signal input 12 of the memory circuit 10 and therefore also to the clock signal input 62 of the means 60, respectively, is smaller than a predetermined boundary frequency. When this is the case, the means 60 generates a deactivation signal at is deactivation signal output 66, which the second voltage generator 30 receives via its deactivation signal input 36 and which causes the deactivation of the second voltage generator 30. The deactivation of the second voltage generator 30 causes that the power consumption and the output power of the second voltage generator 30 almost or completely go back to zero via its power supply input 32 and its voltage output 34, respectively.

If the voltage generators 20, 30 are of the same construction both the common power reception and the maximum possible common output power are halved at components and functional elements of the memory circuit block 40. In this case, the predetermined boundary frequency is preferably selected so that with operating frequencies below this predetermined boundary frequency the components and functional elements of the memory circuit 10, which are connected to the voltage outputs 24, 34 of the voltage generators 20, 30, only take up, via the operating voltage generated by the voltage generators 20, 30, at maximum the electrical power that the active first voltage generator 20 may deliver at maximum.

Figure 2:
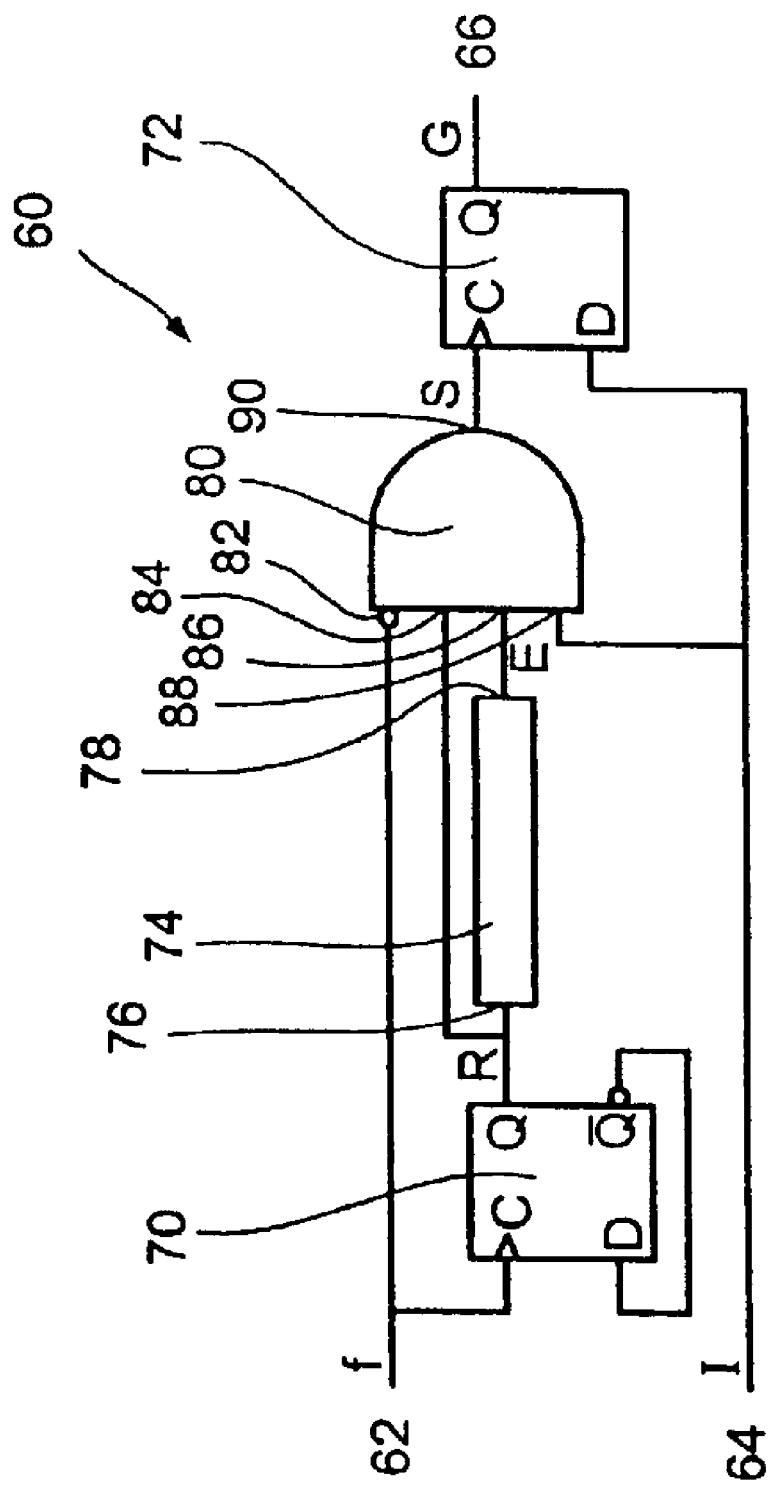
FIG. 2 shows a schematical illustration of a means according to a preferred embodiment of the present invention for determining whether a period of a clock signal is longer than a limiting period.

FIG. 2 is a schematical illustration of a preferred embodiment of the means 60 for selectively deactivating the voltage generators 20, 30. The means 60 includes a first D flip flop 70 with a clock input C, a D input D, a non-inverting output Q and an inverting output $\overline{Q}$, a second D flip flop 72 with a clock input C, a D input D and a non-inverting output Q, a delay circuit 74 having an input 76 and an output 78 and an AND gate 80 having an inverting input 82 and a first, a second and a third non-inverting input 84, 86, 88 and an output 90. The delay circuit 74 includes for example an RC component or a series circuit of inverters.

The clock input C of the first D flip flop 70 is connected to the first clock signal input 62, the D input D of the first D flip flop 70 is connected to the inverting output $\overline{Q}$ of the same and the non-inverting output Q of the first D flip flop D is connected to the input 76 of the delay circuit 74 and to the first non-inverting input 84 and the AND gate 80. The output 78 of the delay circuit 74 is connected to the second non-inverting input 86 of the AND gate 80, the inverting input 82 of the AND gate 80 is connected to the clock signal input 62, the third non-inverting input 88 of the AND gate 80 and the D input D of the second D flip flop 72 are connected to the initialization signal input 64. The output 90 of the AND gate 80 is connected to the clock input C of the second D flip flop 72 and the non-inverting output Q of the second D flip flop 72 is connected to the deactivation signal output 66.

Figure 3:
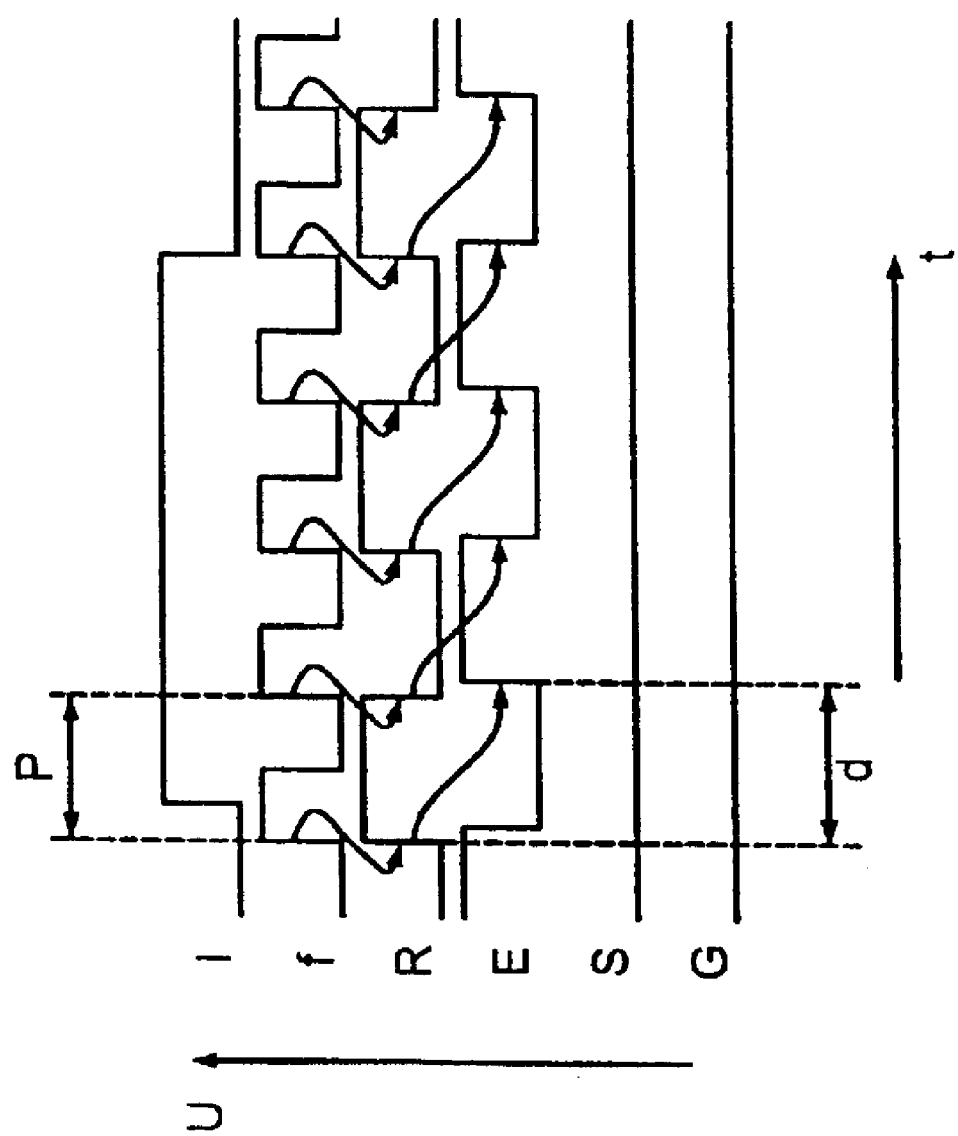
FIG. 3 shows a schematical illustration of time-dependencies of signals at the circuit of FIG. 2.

The function of the means 60 is described in the following referring to FIGS. 3 and 4. FIGS. 3 and 4 are schematical illustrations of the time-dependencies of several signals, wherein to the right the time t and upwards the signal levels U are plotted in any unit. An initialization signal I is applied to the initialization signal input 14 of the memory circuit 10 from an exterior circuit and therefore via the initialization signal input 64 of the means 60 to the third non-inverting input 88 of the AND gate 80 and to the D inputs D of the second D flip flop 72. A clock signal f is applied from the exterior circuit to the clock signal input 12 of the memory circuit 10 and therefore via the clock signal input 62 of the means 60 to the clock input C of the first D flip flop 70 and to the inverting input 82 of the AND gate 80. Each rising edge of the clock signal f triggers the first D flip flop 70. As the inverting output $\overline{Q}$ and the D input D of the first D flip flop 70 are short-circuited, the first D flip flop 70 generates a signal R at the non-inverting output Q which comprises half the frequency of the clock signal f. This signal R is applied to the first non-inverting input 84 and the AND gate 80 and in parallel at the input 76 of the delay circuit 74. The delay circuit 74 delays the signal R and generates a signal E at its output 78, respectively, which is delayed by a predetermined period of time d with regard to the signal R. The FIGS. 3 and 4 are different in that in FIG. 3 the case id illustrated that period p is smaller than the predetermined period of time d and in FIG. 4 the period p is longer than the predetermined period of time d.

In the case p<d illustrated in FIG. 3 the values both of the initialization signal I and the inverse of the clock signal f, the signal R and the signal E at no times simultaneously correspond to a logical one ("high"). A signal S generated by the AND gate 80 at the output 90 therefore corresponds to a logical zero ("low") at all times. Therefore, a signal G generated by the second D flip flop 72 at the non-inverting output Q which is applied to the deactivation signal input 36 of the second voltage generator 30 via the deactivation signal output 66 of the means 60 corresponds to a logical zero at any time. Consequently, both the current which may be supplied by the voltage generators 20, 30 and the power which may be output by both of them and the power taken up by the voltage generators 20, 30 together via the power supply inputs 22, 32 corresponds to the values for the maximum operating frequency of the memory circuit 10.

In the case p>d illustrated in FIG. 4 there is a time interval whose duration corresponds to the difference between the period p and the predetermined period of time d before each second rising edge of the clock signal f in which both the initialization signal I and the inverse of the clock signal f, the signal R and the signal E simultaneously corresponds to a logical one. Consequently, in this time interval also the signal S generated by the AND gate 80 at the output 90 corresponds to a logical one, i.e. further pulses with the value of a logical 1 are generated. From the first point of time at which the signal S corresponds to a logical one the deactivation signal G generated by the second D flip flop at the output Q corresponds to a logical one. This deactivation signal G is received by the second voltage generator 30 at the deactivation signal input 36 and causes the second voltage generator 30 to be deactivated. Consequently, both the power which may be supplied together by the voltage generators 20, 30 at the voltage outputs 24, 34 and the overall current consumption of the voltage generators 20, 30 via the power supply inputs 22, 32, respectively, amount to half of the value for the maximum operating frequency of the memory circuit 10.

It may be seen from FIG. 3 and 4 that the boundary between the state of maximum power consumption and the state of half of the maximum power consumption of the voltage generators 20, 30 is exactly where the period p of the clock signal f corresponds to the predetermined period of time d. The predetermined period of time d therefore determines a boundary frequency, wherein the overall power consumption of the voltage generators 20, 30 corresponds to the power consumption at the maximum operating frequency of the memory circuit 10 when the operating frequency is higher than the boundary frequency, and wherein the overall power consumption of the voltage generators 20, 30 is only half as high when the operating frequency of the memory circuit 10 lies below this boundary frequency. The circuit illustrated in FIG. 2 is useable as long as $d/2<p<2d$.

When the memory circuit 10 comprises three or more voltage generators, with a corresponding number of circuits, as it is illustrated in FIG. 2, several boundary frequencies may be defined, below which selectively one or several voltage generators are respectively deactivated. The higher the number of voltage generators, the more precise the overall power consumption of the voltage generators may be adjusted to the actually required quantity. At that, numerous variations of the circuit illustrated in FIG. 2 or other circuits generating a corresponding deactivation signal G may be used.

The voltage generators 20, 30 do not have to be of the same construction. Preferably, the available power or the available current, respectively, of the voltage generators is adjusted to the power consumption of the downstream consumers with preferred operating frequencies. When a memory circuit is for example mainly provided for operating frequencies of 200 MHz and 133 MHz, with which the voltage generators need to provide 24 mA or 16 mA, respectively, at maximum, a voltage generator which may provide 16 mA and a voltage generator which may provide 8 mA and which be deactivated at operating frequencies of a maximum of 133 MHz may be provided. Alternatively, three voltage generators which may respectively provide 8 mA and of which one may be deactivated at an operating frequency of a maximum 133 MHz may be provided.

In the circuit and the means 60, respectively, illustrated in FIG. 2, a change of the deactivation signal G is only possible as long as the initialization signal I corresponds to a logical one. The circuit is therefore especially suitable for those cases in which the operating frequency of the memory circuit does not change any more after the initialization phase. For other cases the circuit is preferably modified so that any time during the operation of the memory circuit a falling below or exceeding, respectively, of the boundary frequency causes a deactivation or activation, respectively, of a voltage generator.

In the embodiment illustrated in FIG. 1 the means 60 is arranged within the memory circuit 10, wherein preferably the overall memory circuit is integrated monolithically within a semiconductor device. Alternatively, the circuit illustrated in FIG. 2 is fully or in part arranged externally to the memory circuit 10. The circuit illustrated in FIG. 2 is then preferably integrated within the memory controller, wherein the memory circuit receives the deactivation signal from the memory controller. The means 60 for selectively deactivating which is arranged within the memory circuit 10 then includes in the simplest case only one input for receiving the deactivation signal and one circuit for supplying the same to the voltage generator(s).

When the operating frequency of the memory circuit 10 is already known from the time of manufacturing, then the means 60 for selectively deactivating preferably comprises a means programmable by masking or by fuse blowing of a meltable fuse, by which a deactivation signal G is permanently settable or one or several voltage generators may be deactivated directly. A voltage generator may for example be deactivated by interrupting its connection to the power supply. A memory circuit programmed by masking or fuse melting of the meltable fuse preferably directly after manufacturing may, however, not be used with frequencies above the boundary frequency anymore, is, however, optimized regarding its current consumption for operating frequencies up to the boundary frequency and therefore represents a simple and low-cost alternative for a special low power design and for developing a low power memory circuit, respectively, which comprises a lower number of voltage generators from the beginning.

The present invention therefore saves the effort for a parallel development of memory circuits whose current consumption is optimized for different operating frequencies and for the manufacturing of production tools, for example lithography masks.

A selective activation of voltage generators, when the operating frequency is above the boundary frequency, is functionally equivalent to the described selective deactivation of one or several voltage generators when the operating frequency is below a predetermined boundary frequency. In this case, an activation signal is provided or generated by a circuit, which is similar to the one illustrated in FIG. 2, and applied to one or several voltage generators. When the activation signal corresponds to a logical zero ("low") the one or the several voltage generators are deactivated, and when the activation signal corresponds to a logical one ("high"), the one or the several voltage generators are activated.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. Memory circuit, comprising:

several voltage generators for generating an operating voltage for memory elements of the memory circuit;

mean for selectively setting a current being deliverable by the several voltage generators depending on an operating frequency for the memory circuit;

the means for selectively setting including means for selectively deactivating the voltage generators depending on the operating frequency; and means for determining whether the operating frequency is lower than a predetermined boundary frequency;

the means for selectively deactivating being constructed to deactivate at least one of the voltage generators when the operating frequency is lower than the predetermined boundary frequency; and the means for determining including means for determining whether a period of a clock signal applied to the memory circuit is longer than a boundary period corresponding to the predetermined boundary frequency.

2. Memory circuit according to claim 1, wherein the means for determining whether the period is longer than the boundary period includes:

a first D flip flop having a clock input, a D input, a non-inverting output and an inverting output;

a second D flip flop having a clock input, a D input (D) and a non-inverting output;

a delay circuit having an input and an output for receiving an input signal at the input and for outputting an output signal at the output, wherein the output signal is delayed by a predetermined period of time corresponding to the boundary period in relation to the input signal; and an AND gate with an inverting input, a first, a second and a third non-inverting input and an output.

wherein the clock input of the first D flip flop and the inverting input of the AND gate arm connected to a clock signal input of the memory circuit, wherein the non-inverting output of the first D flip flop is connected to the input of the delay circuit and the first non-inverting input of the AND gate, wherein the inverting output of the first D flip flop is connected to the D input of the first D flip flop.

wherein the output of the delay Circuit is connected to the second non-inverting input of the AND gate, wherein an initialization signal input of the memory circuit is connected to the third non-inverting input of the AND gate and to the D input of the second flip flop, wherein the output of the AND gate is connected to the clock input of the second flip flop, and wherein the non-inverting output of the second D flip flop connected to a deactivation signal output of the means for selectively deactivating.

3. Memory circuit according to claim 1, further comprising a means for determining whether the operating frequency is lower than a further predetermined boundary frequency, wherein the means for selectively deactivating is further provided to deactivate a further one of the voltage generators when the operating frequency is lower than the further predetermined boundary frequency.

4. Method for manufacturing a memory circuit, comprising:

providing a plurality of voltage generators;

determining whether an operating frequency of the memory circuit is lower than a predetermined boundary frequency; and permanently deactivating least one of the plurality of voltage generators when the operating frequency is lower than the predetermined boundary frequency.

5. Method according to claim 4, wherein the step of deactivating includes a step of masking or step of blowing a fuse.

6. Method for operating a memory circuit including a plurality of voltage generators, comprising:

determining whether an operating frequency of the memory circuit is lower than a predetermined boundary frequency by determining whether a period of a clock signal applied to the memory circuit is longer than a boundary period corresponding to the predetermined boundary frequency; and deactivating at least one of the voltage generators when the operating frequency is lower than the boundary frequency.

7. Method according to claim 6, wherein the steps of determining and of deactivating are performed during an initialization of a memory circuit.

8. Memory circuit, comprising:

one or several voltage generators for generating an operating voltage for memory elements of the memory circuit; and means for selectively setting a current deliverable by the one or the several voltage generator depending on an operating frequency for the memory circuit by permanently deactivating one of the voltage generators.

9. Memory circuit according to claim 8, wherein the means for selectively setting includes a maskable programming means or a meltable fuse for programming the deliverable current.

10. Memory circuit, comprising:

several voltage generator for generating an operating voltage for memory elements of the memory circuit; and means for selectively setting a current deliverable by the several voltage generators depending on an operating frequency for the memory circuit;

the means for selectively setting including means for turning off at least one of the voltage generators depending on the operating frequency.

* * * * *